United States Patent
Tan et al.

(10) Patent No.: US 7,092,692 B2
(45) Date of Patent: Aug. 15, 2006

(54) THRESHOLD VOLTAGE (VTH), POWER SUPPLY (VDD), AND TEMPERATURE COMPENSATION BIAS CIRCUIT FOR CMOS PASSIVE MIXER

(75) Inventors: Chun Geik Tan, Singapore (SG); Masaaki Itoh, Singapore (SG)

(73) Assignees: Agency for Science, Technology and Research, Singapore (SG); Oki Techno Center (Singapore) Pte. LTD, Singapore (SG)

( * ) Notice: Subject to any disclaimer, the term of this patent is extended or adjusted under 35 U.S.C. 154(b) by 475 days.

(21) Appl. No.: 10/403,573

(22) Filed: Mar. 31, 2003

(65) Prior Publication Data

US 2004/0192244 A1     Sep. 30, 2004

(51) Int. Cl.
*H04B 1/28* (2006.01)
*H04B 1/16* (2006.01)

(52) U.S. Cl. .................. 455/333; 455/343.1; 327/530
(58) Field of Classification Search .......... 455/313, 455/323, 333, 334, 343.1; 327/113, 356, 327/530, 535
See application file for complete search history.

(56) References Cited

U.S. PATENT DOCUMENTS

| | | | | |
|---|---|---|---|---|
| 5,036,473 A | | 7/1991 | Butts et al. | 364/489 |
| 5,153,469 A | * | 10/1992 | Petted et al. | 327/113 |
| 5,222,016 A | * | 6/1993 | Matsumoto et al. | 455/333 |
| 5,532,637 A | * | 7/1996 | Khoury et al. | 327/113 |
| 5,640,122 A | | 6/1997 | McClure | 327/530 |
| 5,936,475 A | | 8/1999 | Tchamov et al. | 331/57 |
| 6,057,714 A | * | 5/2000 | Andrys et al. | 327/113 |
| 6,061,051 A | | 5/2000 | Chan et al. | 345/173 |
| 6,366,071 B1 | | 4/2002 | Yu | 323/316 |
| 6,373,329 B1 | | 4/2002 | Hosoi et al. | 327/538 |
| 6,411,154 B1 | | 6/2002 | Mikulenka | 327/530 |
| 6,552,586 B1 | * | 4/2003 | Grasset et al. | 327/113 |
| 6,653,885 B1 | * | 11/2003 | Wu et al. | 327/356 |

OTHER PUBLICATIONS

Razavi, RF Microelectronics, Prentice Hall PTR, pp. 194, 2000, Chapter 6, Low-Noise Amplifiers and Mixers.
Lee, The Design of CMOS Radio-Frequency Integrated Circuits, Cambridge Univ. Press, pp. 331-335, 1998.
Shahani et al., "A 12-mW Wide Dynamic Range CMOS Front-End for a Portable GPS Receiver", IEEE Jrnl. of Solid State Circuits, vol. 32, No. 12, Dec. 1997, pp. 2061-2070.

* cited by examiner

*Primary Examiner*—Quochien B. Vuong
(74) *Attorney, Agent, or Firm*—George D. Saile; Stephen B. Ackerman

(57) ABSTRACT

A biasing circuit for a CMOS passive mixer core to stabilize its conversion gain, linearity and noise figure. The RF inputs are fed differentially from the two RF ports, the LO inputs are fed differentially from the two LO ports, and the IF outputs are obtained at the two IF ports. The biasing circuit comprises a reference current derived from the bandgap voltage and a n-channel MOSFET transistor. The conversion gain is stabilized by keeping the Vgs–Vth value of the passive mixer core almost constant at all process corners, temperature and power supply changes. This is achieved by implementing Vs in such a way that it will increase the same amount as VDD decreases, and that Vs will decrease the same amount as Vth increases.

25 Claims, 4 Drawing Sheets

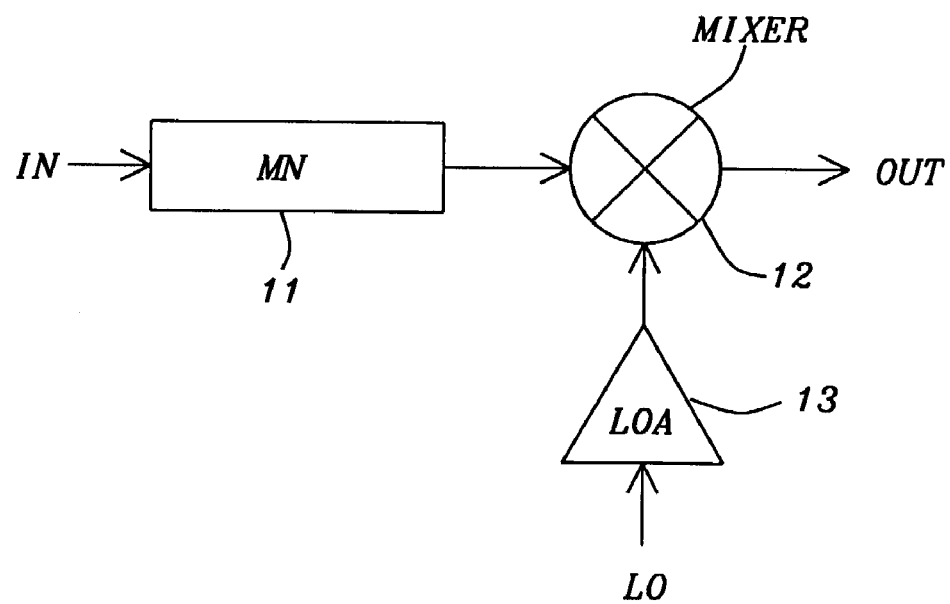
FIG. 1 – Prior Art
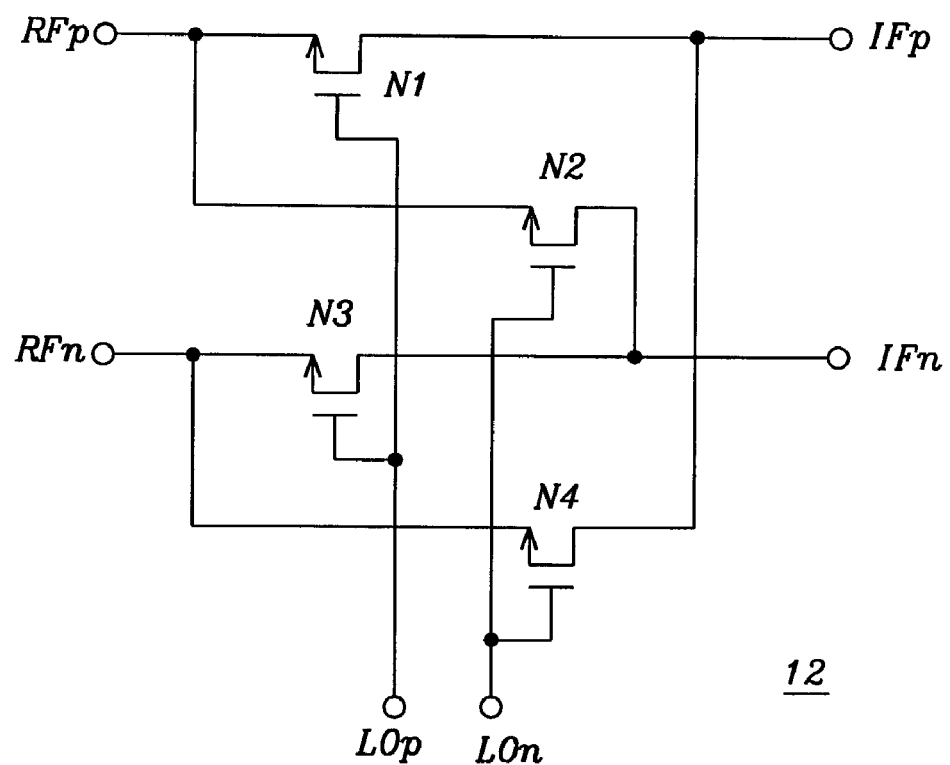
FIG. 2

THRESHOLD VOLTAGE (VTH), POWER SUPPLY (VDD), AND TEMPERATURE COMPENSATION BIAS CIRCUIT FOR CMOS PASSIVE MIXER

FIELD OF THE INVENTION

The invention relates to radio frequency (RF) mixers, and more particularly to a compensation bias circuit for use with CMOS passive mixers.

DESCRIPTION OF THE RELATED ART

FIG. 1 shows the block diagram of a passive mixer of the prior art, where 11 (MN) is the matching network for the mixer with input IN, 12 (MIXER) is the passive mixer core, and 13 (LOA) is the local oscillator (LO) amplifier (buffer). The MIXER has an output OUT. Connections in FIG. 1, though shown as single lines, are paired lines. The conversion gain, noise figure, and linearity performance of a CMOS passive mixer will be varied by the Vth of transistors, the circuit operating temperature, and power supply variation to the circuit. In a standard CMOS process, threshold voltage of a deep sub-micron transistor can vary as much as ±20%, at different process corners. Additionally, the 10% power-supply variation and the circuit operating temperature from −35° C. to 85° C. worsen the stability of the various performance parameters such as conversion gain, noise figure, and linearity. Refer to Behzad Razavi, *RF Microelectronics*, Prentice Hall PTR, pp. 194, 2000, Thomas H. Lee, *The Design of CMOS Radio Frequency Integrated Circuits*, Cambridge, pp. 331–335, 1998, and Arvin R. Shahani, Derek K. Shaeffer, and Thomas H. Lee, ":*A 12-m W Wide Dynamic Range CMOS Front-End for a Portable GPS Receiver*," volume 32, No 12. IEEE Journal of Solid-State Circuits, pp.2061-2070, December 1997.

Active mixers have another set of problems which makes them equally unattractive for use as mixers. In a typical active mixer the local oscillator (LO) input drives a frequency mixing stage (typically comprising four identical transistors, $M_{LO}$, and arranged as two differential amplifier stages, with current I each, and two load resistors, $R_L$) and where the RF input drives a V-to-I conversion stage (typically comprising two identical transistors, $M_{RF}$, and a current source with current 2I for each transistor). Disadvantages of active mixers are:

a) the (Vgs–Vth) value of $M_{LO}$ is self adjusted (when I is fixed) with a different Vth, VDD and temperature.

b) The Gm of $M_{RF}$ varies with a different Vth, VDD and temperature.

c) A process variation of 20% of load resistors $R_L$ causes conversion gain variations, and d) since current I tracks the Gm of $M_{RF}$ when Vth, VDD, and temperature vary, then (Vgs–Vth) of $M_{LO}$ will be different with a different Vth, VDD and temperature.

U.S. Patents which bear on the subject of the present invention are:

U.S. Pat. No. 5,936,475 (Tchamov et al.) discusses a passive mixer but uses transformer connections which act as passive mixer.

U.S. Pat. No. 6,411,154 (Mikulenka) describes a bias circuit comprising two bipolar transistor where the first of the two bipolar transistors provides a biasing voltage to an external transistor.

U.S. Pat. No. 6,373,329 (Hosoi et al.) teaches a two stage biasing circuit comprising a bipolar transistor and resistor, both for temperature compensation, and a field effect transistor plus source resistor.

U.S. Pat. No. 6,366,071 (Yu) discloses a bandgap reference circuit where the PTAT and PTVBE currents are summed in a resistive circuit to generate the bandgap or sub-bandgap reference voltage.

U.S. Pat. No. 6,016,051 (Can) describes an adjustable bandgap reference circuit for low voltage and compensated for temperature, comprising a PTAT current source, a bias current source, two resistors and a transistor.

U.S. Pat. No. 5,640,122 (McClure) presents bias circuits which compensate for power supply variations, for p-channel transistor and process parameters.

None of the above cited examples of the related art provide a biasing circuit for a passive mixer which would stabilize its conversion gain, linearity, and noise figure. The bias circuit of the present invention corrects this by supplying a tracking bias-voltage to a passive mixer to compensate for variations of the threshold voltage, temperature, and power supply. With this technique a passive mixer, which gives excellent linearity performance, can be used in most designs without any disadvantages.

SUMMARY OF THE INVENTION

It is an object of at least one embodiment of the present invention to provide circuits and a method to stabilize the conversion gain, linearity and noise figure of a passive mixer.

It is another object of the present invention to cancel Vth and temperature variations through dynamic DC biasing.

It is yet another object of the present invention to make the substrate bias of the transistors in the passive mixer core and the transistor in the bias circuit the same.

It is still another object of the present invention to make the variation of the conversion gain very small and thus to maintain excellent linearity performance.

These and many other objects have been achieved by providing a biasing circuit for the CMOS passive mixer core. The mixer core's RF inputs are fed differentially from the two RF ports, the LO inputs are similarly fed differentially from the LO ports, and the IF outputs are available at the IF ports. The mixer core's four transistors have a current flow of near zero. The biasing circuit comprises a reference current derived from the bandgap voltage and a n-channel MOSFET transistor. In one version of the biasing circuit a resistive means is coupled between the positive side of the power supply and the transistor to introduce an extra voltage drop thus imitating the operating condition of the transistors in the passive mixer core of near zero current. The conversion gain is stabilized through use of the bias circuit because the Vgs–Vth value of the passive mixer core transistors remain almost constant at all process corners, temperature and power supply changes. This is achieved by implementing Vs in such a way that it will increase the same amount as VDD decreases, and that Vs will decrease the same amount as Vth increases.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a block diagram of the mixer of the prior art.

FIG. 2 is a schematic diagram of a CMOS passive mixer core of the preferred embodiment of the present invention.

FIG. 3B is a variation of FIG. 3A.

Use of the same reference number in different figures indicates similar or like elements.

Figure 3A:
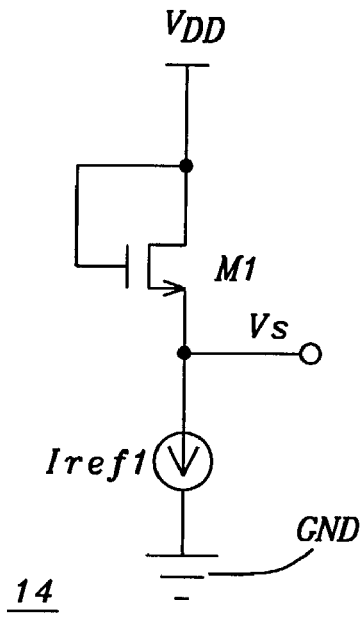
FIGS. 3A and 3B show a schematic diagram of the bias circuit of the preferred embodiment of the present invention, where

These and many other objects and advantages of the present invention will be readily apparent to one skilled in the art to which the invention pertains from a perusal of the claims, the appended drawings, and the following detailed description of the preferred embodiments.

DESCRIPTION OF THE PREFERRED EMBODIMENT

FIG. 2 shows the schematic diagram of a CMOS passive mixer core 12. It comprises four n-channel MOSFET transistors, connected as shown, and allows input frequency up- or down-conversion to an output frequency for any local oscillator (LO) frequency. The radio frequency (RF) inputs are fed differentially from ports RFp and RFn, LO inputs are fed differentially from ports LOp and LOn, and the intermediate frequency (IF) outputs are obtained at ports IFp and IFn. The source and drain of first transistor N1 are coupled between input RFp and output IFp, respectively. The source and drain of second transistor N2 are coupled between input RFp and output IFn, respectively. The source and drain of third transistor N3 are coupled between input RFn and output IFn, respectively, and the source and drain of fourth transistor N4 are coupled between input RFp and output IFn, respectively. The gates of N1 and N3 are coupled to LOp, and gates of N2 and N4 are coupled to LOn.

To stabilize the conversion gain, the value (Vgs−Vth) has to remain constant for all process corners, power supply, and temperature. Thus, $$Vgs-Vth=Vconst \quad (1)$$

Vconst is also called Veff in the literature.

Since LO ports are being preceded by a differential pair with resistive load, the DC value for Vg will change as the power supply varies. For instance, if the DC value is 1.3V with a 1.8V power supply, it will be 1.1V with a 1.6V power supply. Thus, the DC value of Vg can easily be implemented with the function of (VDD−Vref), where Vref can be derived from the bandgap voltage.

From (1), $$VDD-Vref-Vs-Vth=Vconst \quad (2)$$

$$Vs=VDD-Vref-Vth-Vconst \quad (3)$$

Therefore, Vs must be implemented in such a way that it will increase the same amount as the increase in VDD, and it will decrease the same amount as the increase in Vth.

Table 1 presents an example of the Vth values of a particular transistor in passive mixer core 12.

TABLE 1

Vth values of the transistors in passive mixer core at all process corners, temperature (in ° C.), and VDD. Where (slw) stands for slow and (fst) stands for fast.

| vdd | temp | vth0(slw) | vth0(typ) | vth0(fst) |
|---|---|---|---|---|
| 1.6 | −35 | 0.7079 | 0.6455 | 0.5843 |
|  | 25 | 0.6684 | 0.6079 | 0.5485 |
|  | 85 | 0.6289 | 0.5703 | 0.5128 |
| 1.8 | −35 | 0.7307 | 0.6677 | 0.6061 |
|  | 25 | 0.6922 | 0.6312 | 0.5714 |
|  | 85 | 0.6538 | 0.5947 | 0.5368 |
| 2 | −35 | 0.7525 | 0.6891 | 0.627 |
|  | 25 | 0.7151 | 0.6535 | 0.5935 |
|  | 85 | 0.6777 | 0.6181 | 0.56 |

At VDD=1.8V, 25° C., typical process, Vs can be set as 0.9V. Therefore, the Vconst can be computed from equation (2), $$Vconst = 1.3 - 0.9 - 0.6312$$
$$= 0.2312$$

By keeping the (Vgs−Vth) always −0.2312, a bias table for Vs can be constructed as illustrated in Table 2.

TABLE 2

Bias voltage required for Vs for all process corner, temperature (in ° C.), and VDD.

| vdd | temp | vref | vgs-vth | Vs(slw) | Vs(typ) | Vs(fst) |
|---|---|---|---|---|---|---|
| 1.60 | −35 | 0.5 | −0.2312 | 0.6233 | 0.6857 | 0.7469 |
|  | 25 | 0.5 | −0.2312 | 0.6628 | 0.7233 | 0.7827 |
|  | 85 | 0.5 | −0.2312 | 0.7023 | 0.7609 | 0.8184 |
| 1.80 | −35 | 0.5 | −0.2312 | 0.8005 | 0.8635 | 0.9251 |
|  | 25 | 0.5 | −0.2312 | 0.8390 | 0.9000 | 0.9598 |
|  | 85 | 0.5 | −0.2312 | 0.8774 | 0.9365 | 0.9944 |
| 2.00 | −35 | 0.5 | −0.2312 | 0.9787 | 1.0421 | 1.1042 |
|  | 25 | 0.5 | −0.2312 | 1.0161 | 1.0777 | 1.1377 |
|  | 85 | 0.5 | −0.2312 | 1.0535 | 1.1131 | 1.1712 |

Figure 3B:
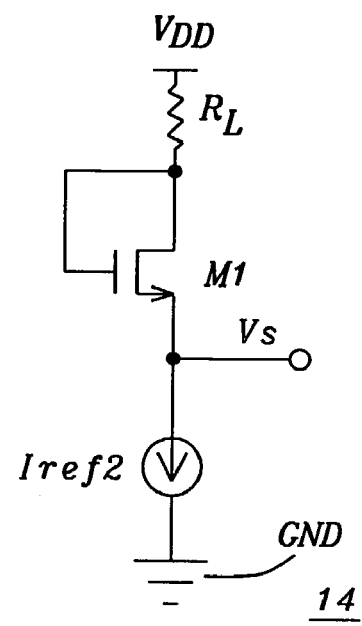
Figure 4:
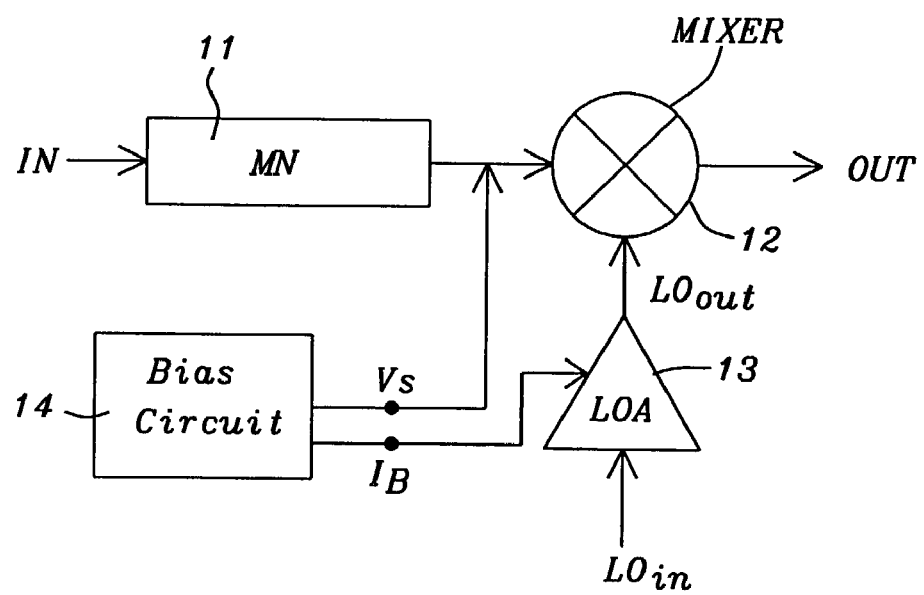
FIG. 4 is a block diagram of the mixer of the preferred embodiment of the present invention, including the bias circuit of FIG. 3A or 3B.
Figure 5:
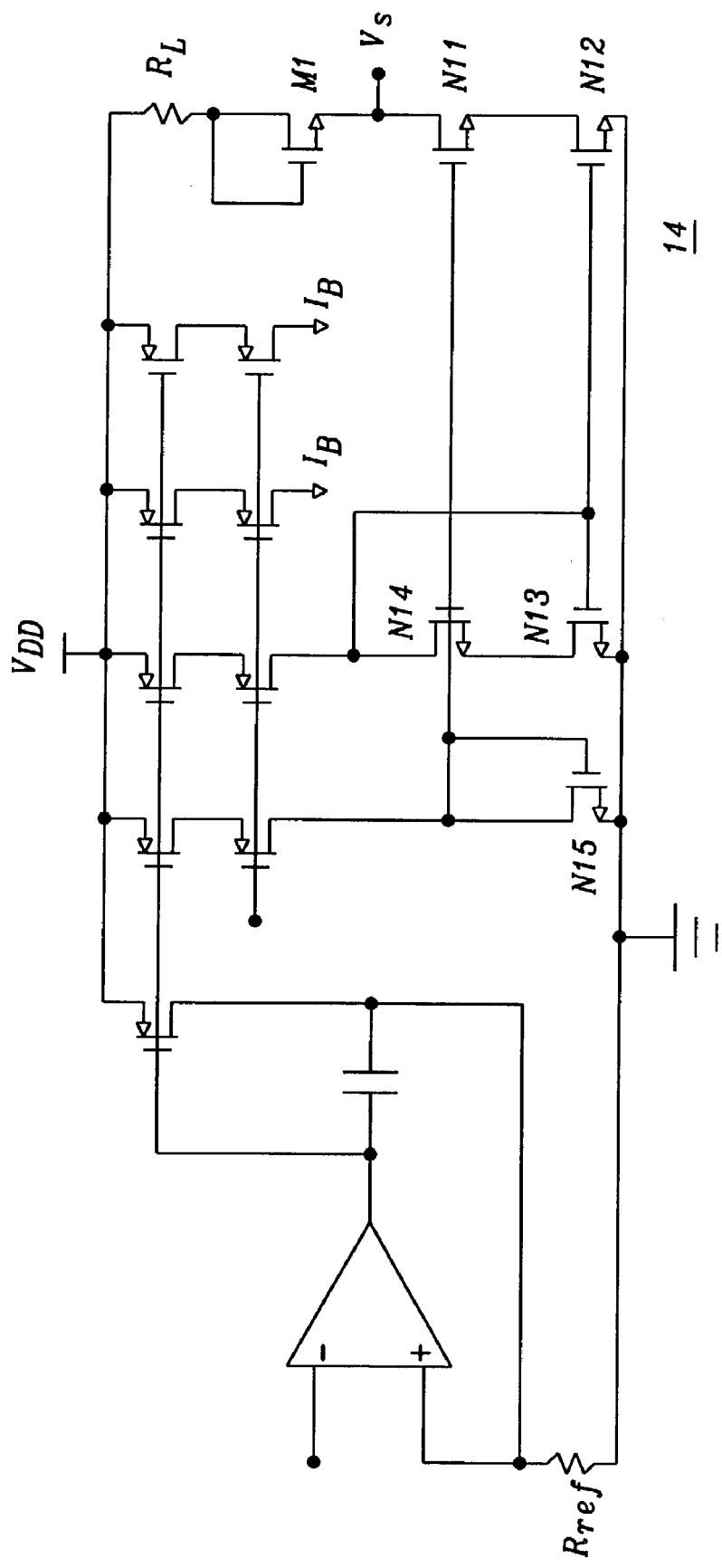
FIG. 5 is a circuit diagram of the bias circuit of FIG. 3B.

FIGS. 3A and 3B show the preferred embodiment of the schematic diagrams for the bias circuit 14. By using the bias circuit, the Vgs-Vth value of the passive mixer core transistors remains almost constant at all process corners, temperature changes and power supply variations. Transistor M1, in series with current source Iref1 or Iref2, respectively, is coupled between the terminals of a power supply, where VDD is the more positive terminal. The other more negative terminal of the power supply is typically ground GND as shown in FIGS. 3A and 3B. Node Vs, with voltage Vs, is the junction of the source of transistor M1 and the current source. In a second preferred embodiment of the bias circuit 14 as illustrated in FIG. 3B, a resistive means $R_L$ is coupled between the drain of transistor M1 and VDD. From FIG. 3A and 3B, the reference currents of Iref1 and Iref2 are derived from the bandgap voltage. Transistor M1 has the same size as the passive mixer core transistors N1–N4. FIG. 5 is a more detailed block diagram of the bias circuit of FIG. 3B, where the same reference numbers indicate the same elements. NMOS transistors N11 to N15 of FIG. 5 are a preferred embodiment of a wide-swing cascode current mirror for Iref2. Node Vs couples typically via reference resistive means (not shown) to the source biasing of RFp and RFn ports of FiG. 2 to dynamically bias the RF ports. The circuit of FIG. 5 further shows, by way of example, a feedback amplifier with reference resistor Rref and wide-swing cascode current mirrors, each with an output $I_B$. In FIG. 4 output $I_B$ is shown coupled to LOA 13 to fix the LO ports DC value. Details of this connection will be discussed below.

In order to insure that the Vgs of the transistor has a sufficient voltage drop, Iref1 must be kept high. However, since the current flow in the passive mixer core transistors is approximately equal to 0 A, high current flows of Iref1 denote a different operating condition of transistor M1 and the transistors N1–N4 in the passive mixer core. An extra voltage-drop can be introduced by simply putting, as already mentioned, resistive means $R_L$ in series with VDD, and, thus, Iref2 is much smaller than Iref1 to imitate the operating condition of the transistors in the passive mixer core.

From FIG. 3B, since transistor M1 is always in saturation, the current flow Iref2 can be represented by, $$Iref2 = K(W/L)(Vgs-Vth)^2 \quad (4)$$

where $K=(\mu_n C_{ox})/2$, $\mu_n$ is the mobility of electrons near the silicon surface, $C_{ox}$ is the gate capacitance.

Thus, when Vth increases due to process variations, Vgs increases by the same amount. But since the gate voltage Vg of transistor M1 is fixed, voltage Vs will decrease by the same amount as Vth increases. Also, as VDD increases due to power supply variations, Vg and Vs will increase the same amount as VDD increases.

Table 3 presents the simulation result on the bias circuit in FIG. 3B and closely matches Table 2.

TABLE 3

Vs values of bias circuit for all process corners, temperature (in ° C.), and VDD.

| vdd | temp | Vs(slw) | Vs(typ) | Vs(fst) |
|-----|------|---------|---------|---------|
| 1.60 | −35 | 0.6164 | 0.6914 | 0.7626 |
|      | 25  | 0.6430 | 0.7177 | 0.7884 |
|      | 85  | 0.6775 | 0.7417 | 0.8117 |
| 1.80 | −35 | 0.7979 | 0.8738 | 0.9456 |
|      | 25  | 0.8234 | 0.8989 | 0.9702 |
|      | 85  | 0.8467 | 0.9217 | 0.9923 |
| 2.00 | −35 | 0.9799 | 1.0570 | 1.1290 |
|      | 25  | 1.0040 | 1.0810 | 1.1520 |
|      | 85  | 1.0260 | 1.1020 | 1.1730 |

FIG. 4 shows a block diagram of the preferred embodiment of the present invention of a passive mixer bias circuit. FIG. 4 is similar to FIG. 1 comprising a matching network 11 (MN), a passive mixer core 12 (MIXER), a local oscillator amplifier 13 (LOA), and a Bias Circuit 14 (per FIGS. 3A or 3B) with a node Vs coupled to the MIXER input. The input port of the LOA is labeled LOin and the output port is labeled LOout.

Figure 6:
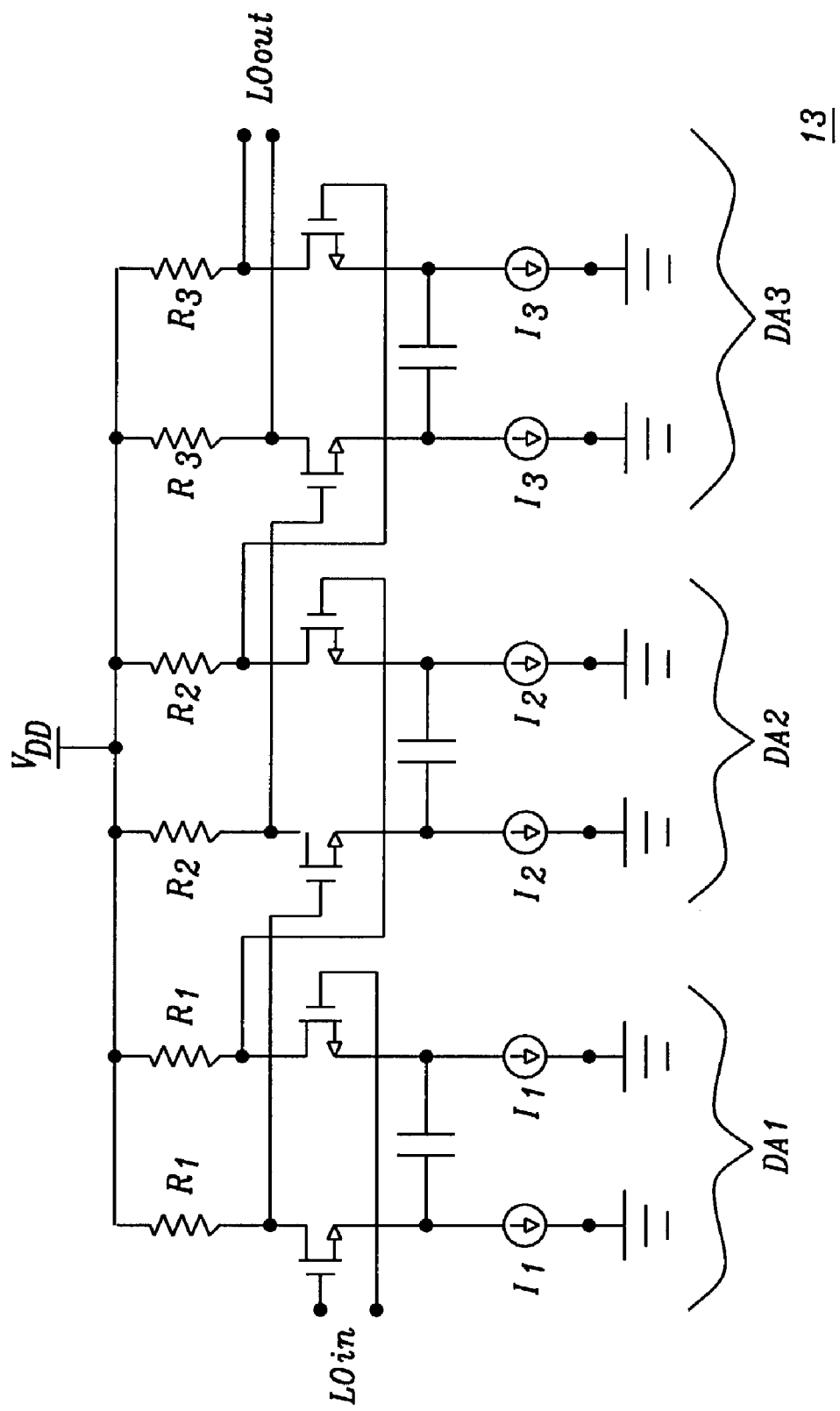
FIG. 6 is a circuit diagram of the preferred embodiment of the LOA of FIG. 4.

Referring now to FIG. 6, we describe the preferred embodiment of the LOA 13 in more detail. The LOA consists of stages of simple differential amplifiers DA1, DA2, and DA3. LO input signals are coupled to the LOin port, amplified by the differential amplifiers DA1, DA2, and DA3, and finally the amplified LO output signals at the LOout port are coupled to the LOp and LOn ports of mixer core 12 of FIG. 2. Differential amplifiers DA1, DA2, DA3 comprise resistor pairs R1, R2, R3 and a pair of current sources I1, I2, I3, respectively. VDD is the power supply for the positive rail of the circuit and the ground symbol indicates the negative power supply return terminal.

In order to maintain a constant value of Vgs–Vth of the transistors in the mixer core, the DC value of the LOout port can be fixed by tracking the resistance of $R_3$. Here, both resistors $R_3$ in FIG. 6 are tracking with Rref, see FIG. 5. This is done by referencing $I_3$ of FIG. 6 (through any kind of current mirror) from $I_B$ (see FIG. 5).

If the resistance of $R_3$ in FIG. 6 is less because of process variations, then Rref in FIG. 5 is less because both resistors $R_3$ and Rref are on the same wafer. Therefore $I_B$ increases accordingly. Since the current of $I_3$ is referenced from $I_B$ the current of $I_3$ increases accordingly and, therefore, maintains the DC value of the LOout port.

The DC value of the LOout port will change with variation of VDD. If VDD decreases, the DC value of the LOout port decreases by the same amount. However, the effects of VDD variations and Vth variations will be compensated by the dynamic biasing Vs in FIG. 5.

The advantages of this bias circuit for passive mixers are:
1. Vth variation can be canceled.
2. The substrate bias of the transistors in the passive mixer core and M1 in the bias circuit is the same.
3. Variation of conversion gain is very small. It is not constant throughout the process and power supply variation because of the slight different in current flows in the transistors.
4. Temperature effects on Vth can be tracked.
5. Because conversion gain is maintained, linearity performance (P1dB, IP3) will be maintained. The noise figure becomes a linear function with temperature after using the compensation bias circuit. This is because as temperature goes down, the transistors in the passive mixer core are "slower", and their on-resistance is higher.

While the invention has been particularly shown and described with reference to the preferred embodiments thereof, it will be understood by those skilled in the art that various changes in form and details may be made without departing from the spirit and scope of the invention.

What is claimed is:

1. A compensation bias circuit for a CMOS passive mixer, comprising:

a mixer having RF input ports, input ports coupled to LO amplifier outputs, and IF output ports, said mixer mixing the RF signal applied to said RF input ports and the amplified LO frequency applied to said input ports coupled to said LO amplifier outputs, said IF output ports supplying an IF signal which is the result of an up-conversion or a down-conversion of said RF signal and said amplified LO frequency, said mixer comprising a plurality of n-channel MOSFET transistors;

a LO amplifier having LO inputs and said LO amplifier outputs, said LO amplifier comprising one or more differential amplifiers coupled in series to amplifiy said LO frequency applied at said LO inputs; and a biasing circuit coupled to said RF input ports, said biasing circuit supplying a tracking bias voltage to said RF input ports to compensate for variations of threshold voltage, temperature, and power supply, said biasing circuit comprising a transistor and a current source coupled serially between terminals of a voltage supply, where a junction of said transistor of said biasing circuit and said current source supplies said tracking bias voltage, said biasing circuit further comprising a reference resistive means and a feedback amplifier which drives cascade current mirrors, where an output of one or more of said current mirrors is coupled to said LO amplifier to maintain constant a value of the gate-source voltage minus a threshold voltage of said n-channel MOSFET transistors of said mixer.

2. The compensation bias circuit of claim 1, wherein said mixer comprises a first, a second, a third, and a fourth transistor, said first transistor coupled between a positive input of said RF input port and a positive output of said IF output port, said second transistor coupled between the positive input of said RF input port and a negative output of said IF output port, said third transistor coupled between a negative input of said RF input port and the negative output of said IF output port, said fourth transistor coupled between the negative input of said RF input port and the positive output of said IF output port, where gates of said first and said third transistor are coupled to a positive input of said LO input port, and , where gates of said second and said fourth transistor are coupled to a negative input of said LO input port.

3. The compensation bias circuit of claim 1, wherein the a reference current of said current source of said biasing circuit is derived from a bandgap voltage.

4. The compensation bias circuit of claim 1, wherein said biasing circuit has a resistive means coupled between a more positive terminal of said voltage supply and said n-channel MOSFET transistor of said biasing circuit.

5. The compensation bias circuit of claim 4, wherein said resistive means introduces an extra voltage drop thus reducing a current flow in said n-channel MOSFET transistor.

6. The compensation bias circuit of claim 1, wherein said n-channel MOSFET transistor of said biasing circuit is equal in size to each of said transistors of said mixer.

7. The compensation bias circuit of claim 1, wherein said up-conversion and down-conversion applies to any said LO frequency.

8. The compensation bias circuit of claim 1, wherein current sources in a last stage of said LO amplifier are controlled by said cascode current mirrors driven by said reference resistive means and said feedback amplifier of said biasing circuit.

9. A compensation bias circuit for a CMOS passive mixer, comprising:
   a matching network receiving an RF signal at inputs IN, where said matching network provides matching between an impedance of said inputs IN and RF inputs of a mixer;
   a LO amplifier buffering a LO frequency applied to LO inputs of said LO amplifier; said LO amplifier comprising one or more differential amplifiers coupled in series to provide an amplified LO frequency signal at LO amplifier outputs;
   said mixer having said-RF input ports coupled to the-outputs of said matching network, LO input ports coupled to said LO amplifier outputs, and IF output ports, said mixer mixing the RF signal applied to said RF input ports and said amplified LO frequency applied to said LO input ports of said mixer, said IF output ports supplying an IF signal which is the result of an up-conversion or a down-conversion of said RF signal and said amplified LO frequency, said mixer comprised of a plurality of n-channel MOSFET transistors such that said RF signal is applied differentially to positive and negative RF input ports, said amplified LO frequency signal is applied differentially to positive and negative LO input ports, and the IF outputs are obtained at positive and negative IF output ports; and
   a biasing circuit coupled to said RF input ports, said biasing circuit supplying a tracking bias-voltage to said RF input ports to compensate for variations of the threshold voltage, temperature, and power supply, said biasing circuit comprising an n-channel MOSFET transistor and a current source coupled serially between the-terminals of a voltage supply, where a junction of said n-channel MOSFET transistor of said biasing circuit and said current source supplies said tracking bias voltage, said biasing circuit further comprising a reference resistive means and a feedback amplifier which drives cascode current mirrors, where an output of one of said current mirrors is coupled to said LO amplifier to maintain constant a value of a gate-source voltage minus a threshold voltage of said n-channel MOSFET transistors of said mixer.

10. The compensation bias circuit of claim 9, wherein said mixer comprises a first, a second, a third, and a fourth transistor, said first transistor coupled between the positive input of said RF input port and the positive output of said IF output port, said second transistor coupled between the positive input of said RF input port and the negative output of said IF output port, said third transistor coupled between the negative input of said RF input port and the negative output of said IF output port, said fourth transistor coupled between the negative input of said RF input port and the positive output of said IF output port, where gates of said first and said third transistor are coupled to the positive input of said LO input port, and, where gates of said second and said fourth transistor are coupled to the negative input of said LO input port.

11. The compensation bias circuit of claim 9, wherein a reference current of said current source of said biasing circuit is derived from a bandgap voltage.

12. The compensation bias circuit of claim 9, wherein said biasing circuit has a resistive means coupled between the a more positive terminal of said voltage supply and said n-channel MOSFET transistor of said biasing circuit.

13. The compensation bias circuit of claim 12, wherein said resistive means introduces an extra voltage drop thus reducing a current flow in said n-channel MOSFET transistor.

14. The compensation bias circuit of claim 9, wherein said n-channel MOSFET transistor of said biasing circuit is equal in size to each of said transistors of said mixer.

15. The compensation bias circuit of claim 9, wherein said up-conversion and down-conversion applies to any said LO frequency.

16. The compensation bias circuit of claim 9, wherein where said output of one of said current mirrors of said biasing circuit maintains constant the value of the gate-source voltage minus the threshold voltage of said n-channel MOSFET transistors of said mixer.

17. The compensation bias circuit of claim 9, wherein current sources in a last stage of said LO amplifier are controlled by said cascode current mirrors driven by said reference resistive means and said feedback amplifier of said biasing circuit.

18. A method of providing a compensation bias for a CMOS passive mixer, comprising the steps of:
   a) providing a mixer core having RF input ports, LO input ports, and IF output ports, said mixer core mixing the RF signal applied to said RF input ports and the LO signal applied to said LO input ports;
   b) supplying an IF signal, at said IF output ports;
   c) coupling a biasing circuit to said RF input ports for supplying a tracking bias voltage to said RF input ports to compensate for variations of threshold voltage, temperature, and power supply;

d) utilizing for said biasing circuit a transistor means and a current source coupled serially between terminals of a voltage supply;
e) supplying said tracking bias voltage from a junction of said transistor means of said biasing circuit and said current source;
f) coupling a LO amplifier with differential stages to said LO input ports to amplify a LO signal applied to an input of said LO amplifier; and
g) fixing a DC level at said LO input ports by coupling outputs of a current mirror to said LO amplifier, where said current mirror is driven by a feedback circuit and referenced by a reference resistive means.

19. The method of providing a compensation bias of claim 18, wherein said mixer core feeds said RF signal differentially to positive and negative RF input ports, applies said LO signal differentially to positive and negative LO input ports, and obtains said IF signal at positive and negative IF output ports.

20. The method of providing a compensation bias of claim 18, wherein a reference current of said current source of said biasing circuit is derived from a bandgap voltage.

21. The method of providing a compensation bias of claim 18, wherein said biasing circuit has a resistive means coupled between a more positive terminal of said voltage supply and said transistor means of said biasing circuit.

22. The method of providing a compensation bias of claim 21, wherein said resistive means introduces an extra voltage drop thus reducing a current flowing in said transistor means.

23. The method of providing a compensation bias of claim 18, wherein said transistor means of said biasing circuit is equal in size to each of said plurality of transistors of said mixer core.

24. The method of providing a compensation bias of claim 18, wherein said up-conversion and down-conversion applies to any said LO frequency.

25. The method of providing a compensation bias of claim 18, wherein current sources in a last stage of said LO amplifier are controlled by said current mirror driven by said feedback circuit and referenced by said reference resistive means.

* * * * *